US006414296B1

United States Patent
Edwards

(10) Patent No.: US 6,414,296 B1
(45) Date of Patent: Jul. 2, 2002

(54) MULTIPLE PIXEL READING OF HOLOGRAPHIC DATA INCLUDING A POSITION ERROR CALCULATION

(75) Inventor: Jathan D. Edwards, Afton, MN (US)

(73) Assignee: Imation Corp., Oakdale, MN (US)

( * ) Notice: Subject to any disclaimer, the term of this patent is extended or adjusted under 35 U.S.C. 154(b) by 111 days.

(21) Appl. No.: 09/666,935

(22) Filed: Sep. 21, 2000

(51) Int. Cl.$^7$ ............................................. H01L 27/00
(52) U.S. Cl. ...................... 250/208.1; 359/22
(58) Field of Search ...................... 250/208.1, 559.29, 250/559.3, 559.39, 559.4, 221; 359/3, 16, 22, 32; 369/44.11, 44.19

(56) References Cited

U.S. PATENT DOCUMENTS

| 5,671,073 A | 9/1997 | Psaltis et al. ................. 359/22 |
| 5,978,112 A | 11/1999 | Psaltis et al. ................. 359/22 |
| 5,982,513 A | * 11/1999 | Zhou et al. ................... 359/22 |

OTHER PUBLICATIONS

"Holographic storage using shift multiplexing," Psaltis et al., *Optics Letters*, vol. 20, No. 7, Apr. 1, 1995, pp. 782–784.
"Shift multiplexing with spherical reference waves," Barbastathis et al., *Applied Optics*, vol. 35, No. 14, 1996, pp. 2403–2417 (Month Unknown).

* cited by examiner

*Primary Examiner*—Que T. Le
(74) *Attorney, Agent, or Firm*—Eric D. Levinson

(57) ABSTRACT

The invention includes a method of generating a position error signal in a holographically imaged data recording system. This method comprises using an optical imaging system to image a plurality of holographically recorded pixels onto a plurality of camera pixels forming a data page. Each holographically recorded pixel is imaged onto an array of at least two adjacent camera pixels in any direction. The output signals from the arrays of camera pixels are used to calculate a position error signal. In a preferred embodiment, the holographically recorded pixel is imaged onto an array of four adjacent camera pixels that form a square having two pixels in each direction.

22 Claims, 5 Drawing Sheets

MULTIPLE PIXEL READING OF HOLOGRAPHIC DATA INCLUDING A POSITION ERROR CALCULATION

This invention was made with Government support under Agreement No. NMA202-97-9-1050 with the National Imagery and Mapping Agency of the United States Department of Defense. The Government has certain rights in this invention.

FIELD OF THE INVENTION

This invention concerns methods and systems for reading holographically recorded data.

BACKGROUND OF THE INVENTION

Researchers have designed holographic data recording systems that potentially could provide commercially interesting recording densities and rates. Examples of such systems are those disclosed in U.S. Pat. Nos. 5,978,112 and 5,671,073 (both Psaltis et al.).

SUMMARY OF THE INVENTION

The present invention includes a method of generating a position error signal in a holographically imaged data recording system. This method comprises using an optical imaging system to image a plurality of holographically recorded pixels forming a data page, wherein each holographically recorded pixel is imaged onto an array of at least two adjacent camera pixels. The output signals from the arrays of camera pixels are used to calculate a position error signal.

The present invention also includes a method of generating a holographic data signal in a holographically imaged data recording system. The optical imaging system operates as set forth above. The output signals from the arrays of camera pixels are used to calculate the holographic data signal.

In one embodiment, the step of using an optical imaging system to image a plurality of holographically recorded pixels comprises choosing an integer ratio of center-to-center spacing between adjacent holographically recorded pixels to center-to-center spacing between adjacent camera pixels which is greater than one. The step of using an optical imaging system to image a plurality of holographically recorded pixels may comprise magnifying an image of a holographically recorded pixel by a factor greater than one.

Each array may be comprised of M×N adjacent camera pixels, with each of M and N being at least two, e.g., 2×2.

The position error signal may be calculated by a multidetector technique based on signals representative of motion in a first direction and signals representative of motion in a second direction. The first and second direction are different, e.g., they are orthogonal to each other.

The present invention also includes generating a translational position error signal. Each array of adjacent camera pixels contributes individually to the generation of the translational position error signal. Each array is comprised of at least four regions A–D: top left A, top right B, bottom left C, and bottom right D. A vertical position error signal is generated by calculating the difference between the sum of (A+B) and the sum of (C+D) for all of the arrays. A horizontal position error signal is generated by calculating the difference of the sum of (A+C) and the sum of (B+D) for all of the arrays.

The present invention also includes generating a rotational position error signal based on vertical and horizontal position error signals calculated for at least one of two halves of the data page.

The position error signals may be used to control relative positioning of a recording medium and the optical imaging array. The position error signals may also be used to control relative positioning of the optical imaging system and the plurality of camera pixels. Control of relative positioning may be accomplished by using a piezomirror to retarget the holographically recorded pixels onto respective centers of the arrays.

The optical imaging system may be used to steer the holographic data page to reduce the position error signal. This steering may be accomplished with a piezomirror.

The present invention also includes a system for generating a position error signal in a holographically imaged data recording system. The system comprises an optical imaging subsystem and a calculating subsystem for implementing the steps described above.

DETAILED DESCRIPTION

One approach to holographic data storage systems uses a "pixel matching configuration." Data is recorded in a storage medium in the form of "Spatial Light Modulator" (SLM) pixels, one "page" (i.e., one X×Y-sized pixel array) at a time.

To read the recorded data, the entire recorded (i.e., previously recorded and now reconstructed) pixel array is imaged onto a suitable pixilated camera array, such that each original pixel is detected by one camera pixel. In one such approach, high volumetric storage density is achieved using a pixel matching system and a shift multiplexing method [Barbasthathis et al, "Shift multiplexing with spherical reference waves," *Applied Optics*, vol. 35, No. 14, pp. 2403–2417 (1996)].

These known systems require significant system complexity, impose stringent limitations on component tolerances, and place extreme requirements on the optical quality of the recording media samples (e.g., optical flatness<0.1 wavelength/cm). Taking both the recording media and recording system into account, these requirements can be generally categorized as precise optical imaging through the system, and repositioning accuracy of the sample relative the system optics.

Figure 1:
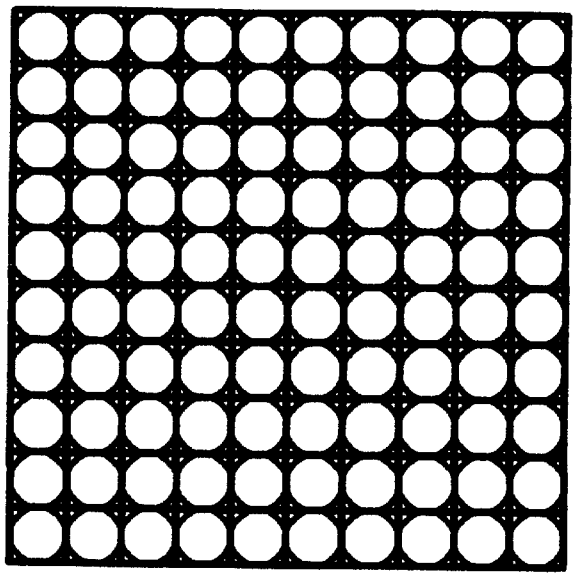
FIG. 1 is schematic view of a prior art embodiment of holographically recorded pixels that are 1:1 matched with camera pixels.
Figure 2:
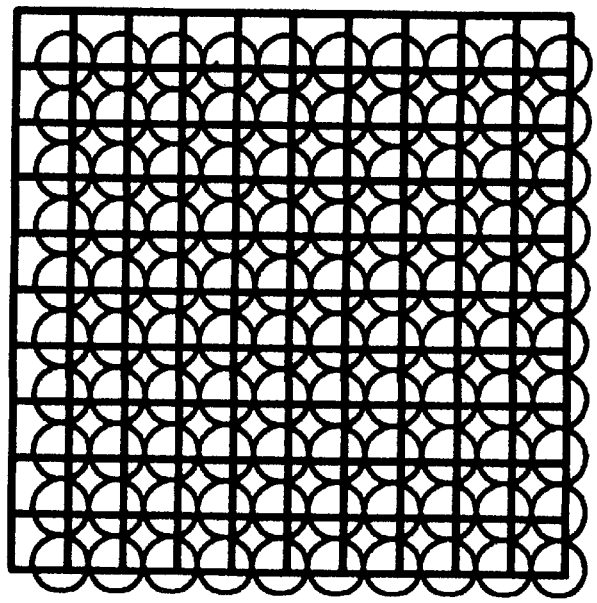
FIG. 2 is schematic view of the embodiment of FIG. 1, but with misregistration error.
Figure 3:
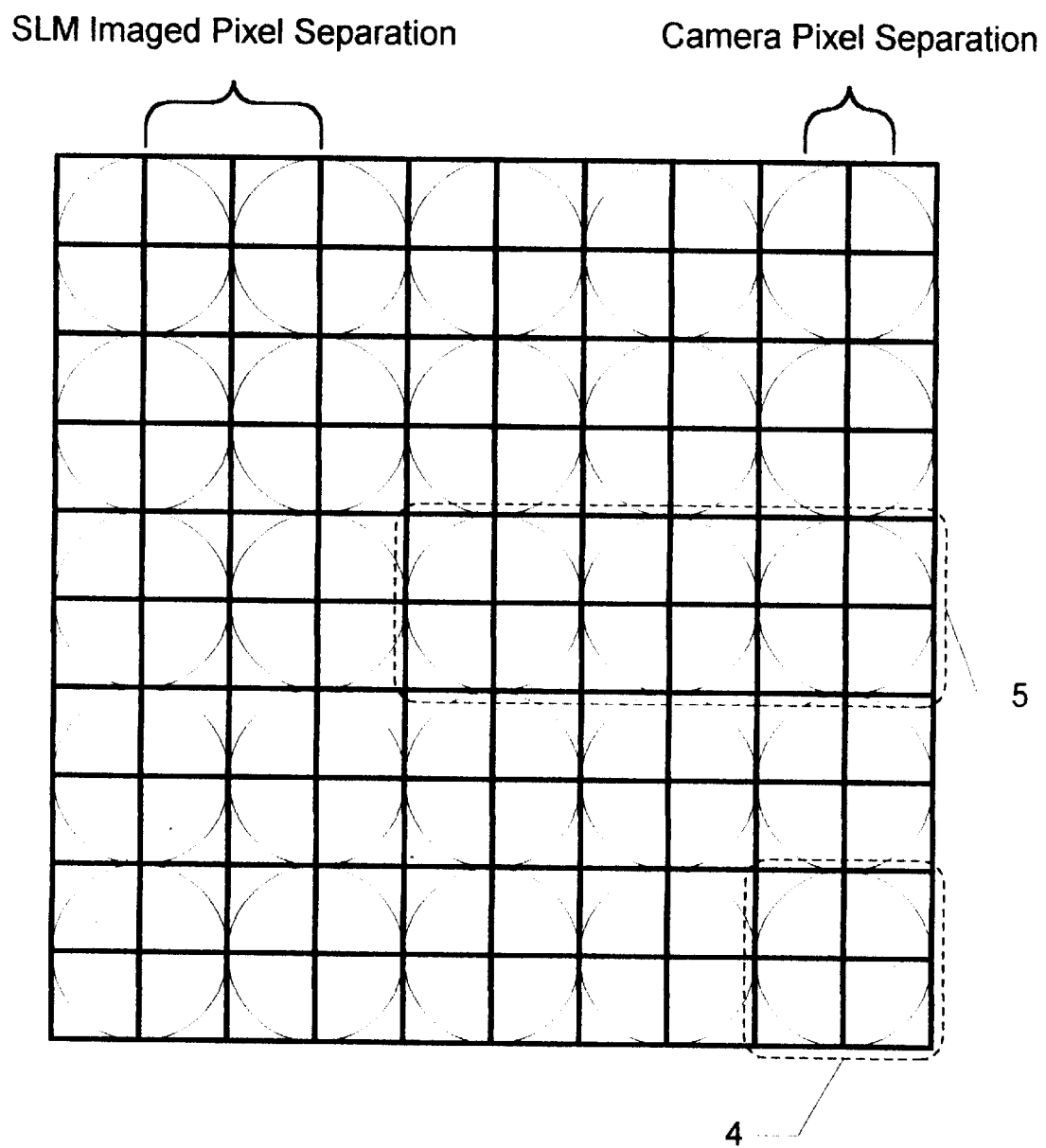
FIG. 3 is schematic view of an embodiment of holographically recorded pixels that are matched with camera pixels according to a preferred N×N, N=2 embodiment of the invention.

To attain the first goal, high quality optical components must be used to uniformly image the reconstructed pixel array as an array of spots on the camera pixel array, as illustrated in FIG. 1. Typical pixel separations (measured center-to-center) are in the range of approximately 14 μm to approximately 24 μm for current technology. Thus, to assure that the pixel array image is precisely centered on the camera array, the sample-to-system alignment must be better than approximately 0.3 μm, or less than 12.5% of the pixel separation, in both X and Y directions. FIG. 2 illustrates an example of such misalignment.

Also, the media cannot be tilted relative to the optical path; tilt error must be small enough to maintain the image misregistration on the camera plane at less than 1/10 of the camera pixel separation, or as little as 1.4 μm. For imaging lenses having long focal lengths, this can mean tilt errors of the order of <10 microradians.

To obtain the second goal, the known approaches required use of only "captive" (non-removable) media, so that misregistrations are limited by the repeatability of the motion control mechanisms. They also need to periodically calibrate the pixel representation with rather elaborate image processing tools and fiducial areas located inside the data page perimeter areas. The system shifts the media in both X and Y directions to record multiple hologram pages.

These are not trivial limitations for a commercially feasible system. The invention described below achieves high data storage densities and data transfer rates without such constraints; it also permits the use of removable media in the system.

The invention provides pixel alignment corrections to sample misregistrations in position, tilt and/or the optical imaging system. Instead of the standard pixel matching scheme that maps one SLM pixel position (as recorded and recovered from the holographic storage medium) onto one camera pixel (so-called 1:1 matching, as illustrated in FIG. 1), the invention involves imaging each single holographically recorded pixel over an array of more than one adjacent camera pixels, as illustrated in FIGS. 2–5. It is not necessary that any single holographically recorded pixel fit within the perimeter of any single camera pixel.

In the preferred embodiment, the holographically recorded pixels are imaged over $N^2$ adjacent and identically sized camera pixels. The number of camera pixels and the size of the camera pixels are, in general, independent factors. Thus, in general, the array could comprise N×M pixels with either N or M being greater than one, e.g., 2×1 or 1×2 arrays. As for the number of pixels, in the preferred embodiment N=M and N is at least two, and most preferably exactly two; thus, each holographically recorded pixel is imaged over at least four (and most preferably exactly four) camera pixels. As for the shape and size of the camera pixels, the preferred embodiment uses identically sized square pixels arranged in aligned rows and columns. It is possible for camera pixels to have varying sizes, although this is not preferred for a variety of reasons including difficulty of manufacture and the additional complexity it creates in using the signals for calculations of the type described below. Similarly, it is possible for the camera pixels to have non-square shapes, but this is also not preferred for the same reasons. Finally, the camera pixels could be arranged other than in simple rows and columns, but again this is not preferred.

Thus, for convenience of description only, this disclosure illustrates the preferred embodiment in which each holographically recorded pixel is matched with an array of four (i.e., M=N=2) square shaped camera pixels, arranged in simple rows and columns to form a square having two pixels in each direction.

One preferred method according to the present invention is to choose the ratio of SLM-to-camera pixel separation to be more than one (preferably exactly two). Another preferred method is to choose the optical magnification of matching pixel separations to be greater than one (preferably exactly two). In either case, the SLM pixel is mapped (through the recording medium) onto four adjacent camera pixels so that each pixel's signal is shared among more than one (preferably four) camera pixels.

Figure 4:
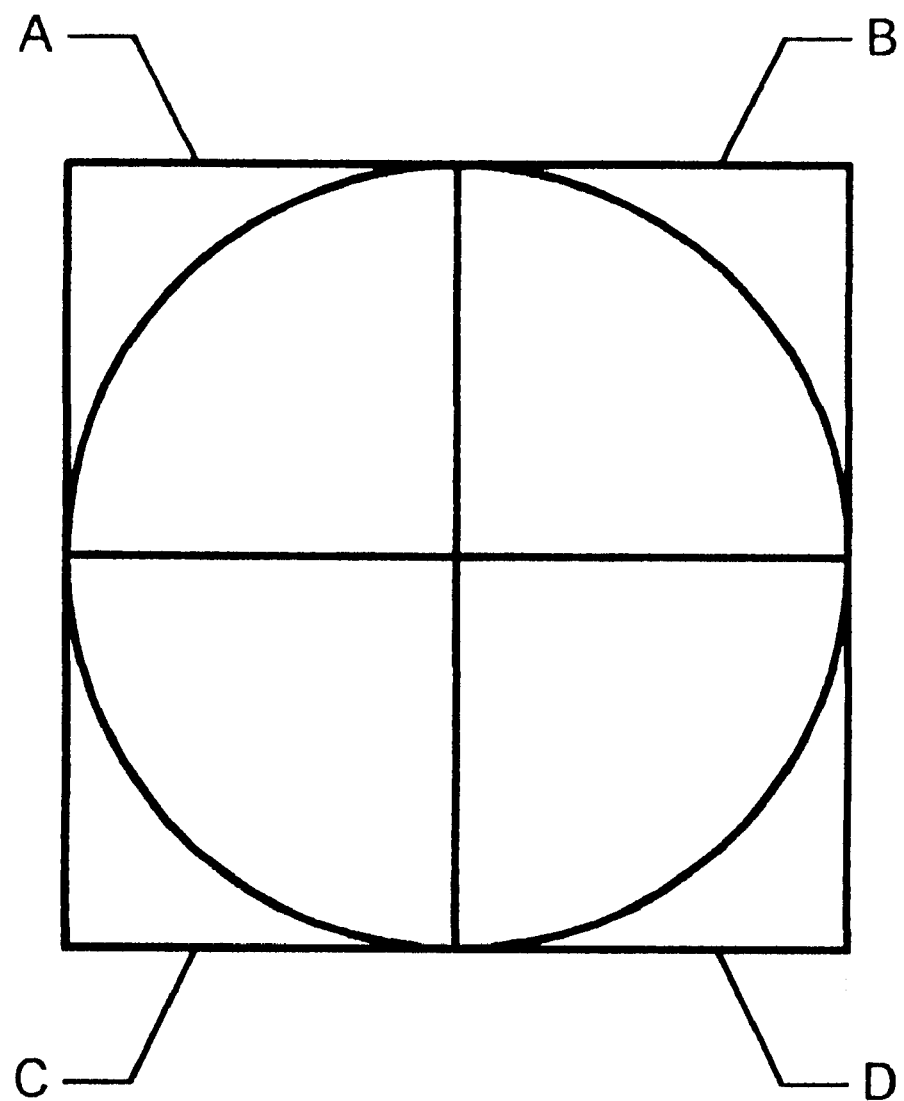
FIG. 4 is a magnified schematic view of a single holographically recorded pixel of FIGS. 3 and 5.
Figure 5:
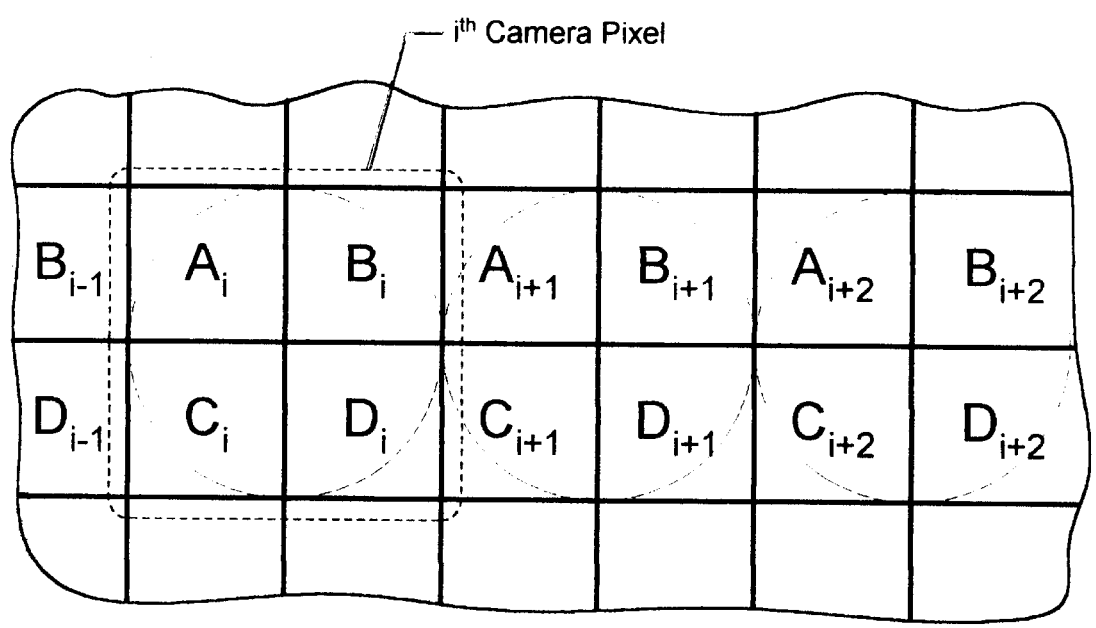
FIG. 5 is a magnified schematic view of a row of holographically recorded pixels of FIG. 3.

FIG. 4 depicts an individual SLM imaged pixel properly centered on its matching array of more than one (as illustrated, four) camera pixels. The pixel intensity (data signal level) may be measured by adding the individual signals of the pixels. In the preferred case of four pixels as illustrated, this sum can be expressed as $A_i+B_i+C_i+D_i$, where i indicates the matched camera pixel array that comprises the $i^{th}$ set of four adjacent pixels {A, B, C, D}. This is an example of a so-called multidetector, which in the specific case of four pixels is known as a quad detector. Detecting the position of the pixel with a multidetector also provides correction signals for the system to direct the pixel image to the center of the array of multiple pixels. For example, as the pixel image moves down (toward the bottom of the Figure) relative to the center of the array of pixels, the detected "vertical error" signal $[(A_i+B_i)-(C_i+D_i)]$ falls below zero by an amount proportional to the distance of displacement. If the pixel image moves up, the signal increases above zero. Similarly, any "horizontal error" may be determined by monitoring the signal $[(A_i+C_i)-(B_i+D_i)]$, with leftward motion producing negative values and rightward motion producing positive values.

The multidetector approach provides a position error signal which may be used for measurement of mistracking, optical pointing, and mechanical errors. In addition, the position error signal may be used to provide feedback for a correcting servo control loop. In the preferred embodiment, for example, a 1024×1024 camera array becomes a 512×512 array of quad detectors, each of which provides servo error signals which may be used to redirect the reconstructed data page pixels to precise positions on the camera array. To accomplish the redirection, the optomechanical system needs to have control of the positioning of the media relative to the optical imaging system and control of the beam pointing between the media and the camera. Such control may include, for example, a piezo mirror which could be used for re-targeting the holographic pixel array onto the respective ABCD centers in accordance with the measured errors from the camera image summations of the individual $A_i$, $B_i$, $C_i$, $D_i$ signals.

These image calculations include summations from arrays of pixels that include, in general, individual pixels that are either "on" (digital one or equivalent) or "off" (digital zero or equivalent). However, only the "on" pixels would substantially contribute to the position error signals. Similarly, an average error symptomatic of the entire page can be calculated from $\Sigma A_i$, (that is, the sum of all $A_i$ values, $\Sigma A_i = A_1+A_2+A_3+ \ldots$), along with the other signals $\Sigma B_i$, $\Sigma C_i$, and $\Sigma D_i$. Individual pixel signal anomalies are expected to average out in calculations of this type.

Misalignments between the holographically recorded pixels and the camera pixels can include a rotational error component in addition to the translational errors described above. In order to provide a rotational error correction signal, the collective translation error signals from each of the two halves of the camera pixel array may be analyzed.

For example, consider a camera pixel array comprised of two halves—upper and lower or left and right—with a translation error signal, generated as described above, calculated for each half. If the servo correction loop has been activated then, by definition, the net sum of the two halves translation errors will also be reduced to zero. If, however, a rotational error exists, then the individual translation errors from each half will not be equal to zero. If the upper half translation error indicates a required motion of the camera pixel array to the right, then the lower half's translation error would indicate a requirement for a leftward motion and the camera pixel array needs to be rotated clockwise to reduce the misalignment between the holographically recorded pixels and the camera pixel arrays. In contrast, an upper half translation error indication for a leftward required motion would require a counterclockwise rotation to correct the misalignment.

In sum, with the overall translational error corrected, a translation error signal generated from any half of a camera pixel array (upper, lower, left or right) may be used to determine the required direction and magnitude of a rotational correction. A clockwise rotational correction would be required for:

(A) a "right" indicated upper half translational error signal;

(B) a "down" indicated right half translational error signal;

(C) a "left" indicated lower half translational error signal; or (D) a "up" indicated left half translational error signal.

A counterclockwise rotational correction would be required for:

(E) a "left" indicated upper half translational error signal;

(F) a "up" indicated right half translational error signal;

(G) a "right" indicated lower half translational error signal; or (H) a "down" indicated left half translational error signal.

To image the SLM pixels onto the media, or to image the recovered page onto the camera detector array, any of several variations for the optical path are possible and known in the art. One example of the a basic so-called 4F system for relaying the object image onto a reconstruction plane (typically a camera plane) is depicted in Psaltis et al., "Holographic storage using shift multiplexing," *Optics Letters,* vol. 20, No.7, p.782. Optical layout varies depending on the relative pixel separations of the SLM and camera; ideally the pixel separations of these components are equal (as noted earlier, the separations are typically 14–24 $\mu$m in current technology, but this is not a limitation on the scope of the invention). Thus, no additional optical magnification or demagnification is needed. More generally, though, any SLM pixel array spacing can theoretically be mapped, with the appropriate optics, onto any camera pixel array with the appropriate optical magnifications. In any of these configurations, the common requirement for the optical system is to relay the image of the illuminated SLM pixels onto an array of uniformly high quality spots of light each centered on its corresponding camera pixel. If the spot quality or alignment of the pixel array image deviates from ideal, pixel-to-pixel signal uniformity will decrease and cross-talk between adjacent pixels will increase. Either of these deviations from ideal result in increased errors in the recovered data.

Figure 6:
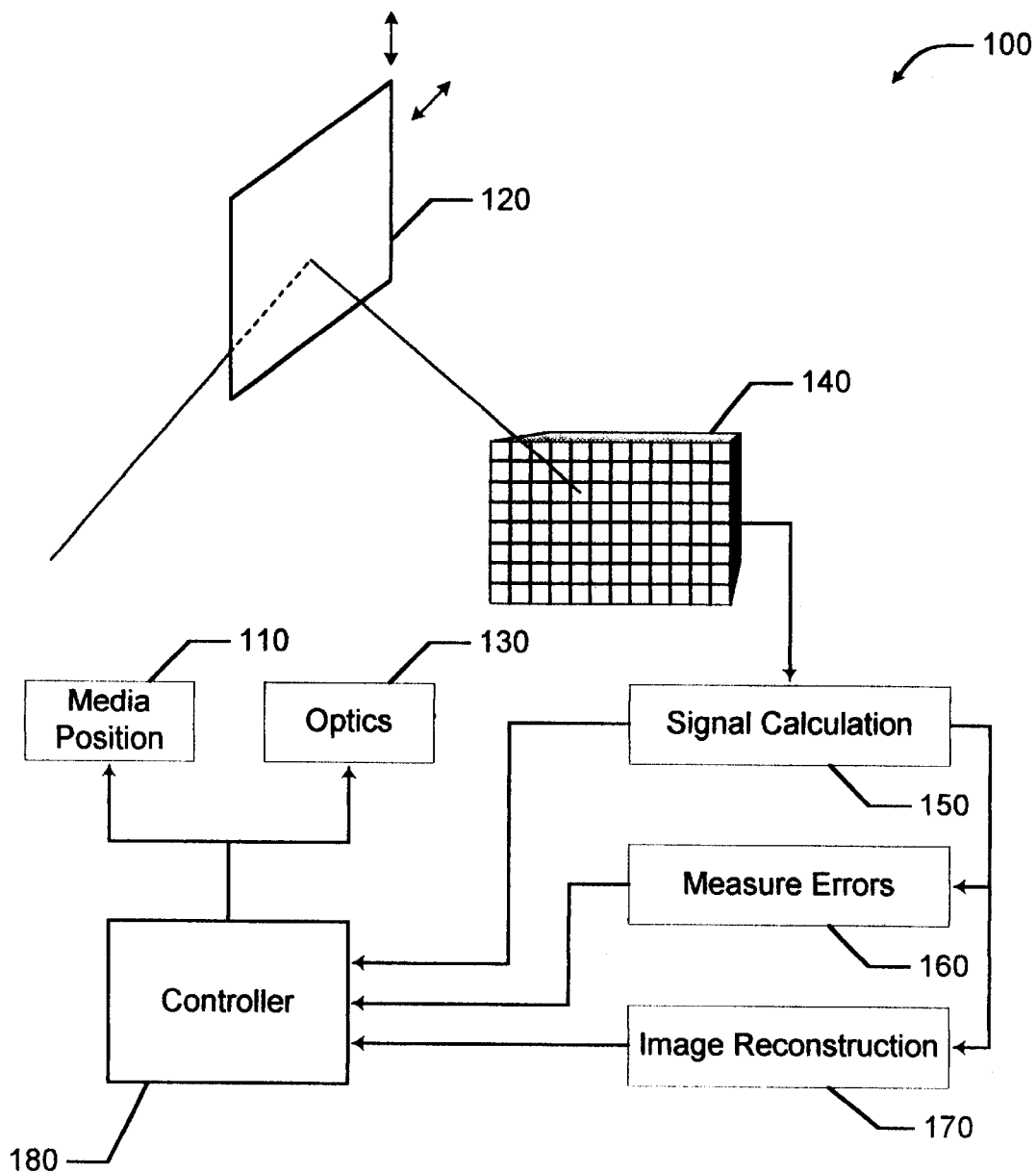
FIG. 6 is a schematic representation of the system aspects of the invention.

FIG. 6 is a schematic representation of the system aspects of the invention. The method aspects of the invention may be practiced in any of a variety of known holographic storage systems, such as those disclosed in U.S. Pat. Nos. 5,978,112 and 5,671,073 (both Psaltis et al.). Thus, many details known to those skilled in the art are omitted from FIG. 6, but this is done only for purposes of convenience and does not imply a limitation on the scope of the invention.

In FIG. 6, system 100 reads holographically recorded pixels. An optical path (conventional details of which are not shown) is adapted to holographically recover an image of each pixel in the array of pixels from a holographic recording medium 120 on which the array of pixels is recorded. In general, the data is recorded such that one may define directions parallel and perpendicular to the direction in which data is recorded, as indicated by the arrows in the Figure. The shape of the medium is shown in schematic form only, and could be a portion of a disk, tape, or any other form of recording medium, whether stationary or not. An optical subsystem 130 shares at least one image of a single recorded pixel over more than one adjacent pixels of camera 140, as described above. Recording medium 120 is controlled by media position subsystem 110 and may be removed from the optical imaging system.

System 100 may further comprise signal calculation subsystem 150 to use outputs from camera 140, as described above. Another subsystem 160 may use the result to measure mistracking, optical pointing, or mechanical errors. Yet another subsystem 170 may use the result to reconstruct the image. Any or all of these subsystems may provide inputs into a controller subsystem 180 that controls relative positioning of recording medium 120 with respect to the optical path. The connection directly between controller 180 and medium 120 is schematic only, as the nature of the control could be any known manner of adjusting the relative positioning. For example, but not to suggest a limitation on the scope of the invention, controller 180 could control a piezomirror to retarget the image onto respective centers of the pixels of camera 140. Another approach is to use media position subsystem 110 to control relative positioning of recording medium 120 with respect to camera 140.

I claim:

1. A method of generating a position error signal in a holographically imaged data recording system, comprising:

using an optical imaging system to image a plurality of holographically recorded pixels onto a plurality of camera pixels forming a data page, wherein each holographically recorded pixel is imaged onto an array of at least two adjacent camera pixels; and using output signals from the arrays of camera pixels to calculate a position error signal.

2. The method of claim 1, wherein using an optical imaging system to image a plurality of holographically recorded pixels comprises choosing an integer ratio of center-to-center spacings between adjacent holographically recorded pixels to center-to-center spacings between adjacent camera pixels which is greater than one.

3. The method of claim 1, wherein using an optical imaging system to image a plurality of holographically recorded pixels comprises magnifying an image of a holographically recorded pixel by a factor of more than one.

4. The method of claim 1, wherein each array is comprised of M×N adjacent camera pixels, with each of M and N being at least two.

5. The method of claim 1, wherein each array is comprised of four adjacent camera pixels that form a square having two pixels in each direction.

6. The method of claim 1, wherein the position error signal is calculated by a multidetector technique based on signals representative of motion in a first direction and signals representative of motion in a second direction, wherein the first and second directions are different.

7. The method of claim 6, wherein the first and second directions are orthogonal.

8. The method of claim 1, wherein generating a position error signal further comprises generating a translational position error signal, and wherein each array of adjacent camera pixels contributes individually to the generation of the translational position error signal, and wherein each array is comprised of at least four regions A–D: top left A, top right B, bottom left C, and bottom right D, wherein a vertical position error signal is generated by calculating the difference between the sum of (A+B) and the sum of (C+D) for all of the arrays, and wherein a horizontal position error signal is generated by calculating the difference of the sum of (A+C) and the sum of (B+D) for all of the arrays.

9. The method of claim 1, wherein generating a position error signal further comprises generating a rotational position error signal based on vertical and horizontal position error signals calculated for at least one of two halves of the data page.

10. The method of claim 1, further comprising using the position error signals to control relative positioning of a recording medium and the optical imaging system.

11. The method of claim 1, further comprising using the position error signals to control relative positioning of the optical imaging system and the plurality of camera pixels.

12. The method of claim 11, in which control of relative positioning comprises controlling a piezomirror to retarget the holographically recorded pixels onto respective centers of the arrays.

13. The method of claim 1, further comprising using the optical imaging system to steer the holographic data page to reduce the position error signal.

14. The method of claim 13, wherein the steering step further comprises using a piezomirror.

15. A system for generating a position error signal in a holographically imaged data recording system, comprising:

an optical imaging subsystem for imaging a plurality of holographically recorded pixels onto a plurality of camera pixels forming a data page, wherein each holographically recorded pixel is imaged onto an array of at least two adjacent camera pixels; and a calculating subsystem for using output signals from the arrays of camera pixels to calculate a position error signal.

16. The system of claim 15, wherein each array is comprised of M×N adjacent camera pixels, with each of M and N being at least two.

17. The system of claim 15, wherein each array is comprised of four adjacent camera pixels that form a square having two pixels in each direction.

18. The system of claim 15, further comprising a multidetector to calculate the position error signal based on signals representative of motion in a first direction and signals representative of motion in a second direction, wherein the first and second directions are different.

19. The system of claim 18, wherein the first and second directions are orthogonal.

20. The system of claim 15, further comprising a recording medium and a subsystem to use the position error signals to control relative positioning of the recording medium with respect to the optical imaging system.

21. The system of claim 15, wherein generating a position error signal further comprises generating a translational position error signal, and wherein each array of adjacent camera pixels contributes individually to the generation of the translational position error signal, and wherein each array is comprised of at least four regions A–D: top left A, top right B, bottom left C, and bottom right D, wherein a vertical position error signal is generated by calculating the difference between the sum of (A+B) and the sum of (C+D) for all of the arrays, and wherein a horizontal position error signal is generated by calculating the difference of the sum of (A+C) and the sum of (B+D) for all of the arrays.

22. The system of claim 15, wherein generating a position error signal further comprises generating a rotational position error signal based on vertical and horizontal position error signals calculated for at least one of two halves of the data page.

* * * * *